US009881862B1

(12) United States Patent
Otremba et al.

(10) Patent No.: US 9,881,862 B1
(45) Date of Patent: Jan. 30, 2018

(54) TOP SIDE COOLING FOR GAN POWER DEVICE

(71) Applicant: Infineon Technologies Austria AG, Villach (AT)

(72) Inventors: Ralf Otremba, Kaufbeuren (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/270,504

(22) Filed: Sep. 20, 2016

(51) Int. Cl.
| | |
|---|---|
| *H01L 23/34* | (2006.01) |
| *H01L 23/498* | (2006.01) |
| *H01L 23/495* | (2006.01) |
| *H01L 23/367* | (2006.01) |
| *H01L 29/20* | (2006.01) |
| *H01L 23/433* | (2006.01) |
| *H01L 23/42* | (2006.01) |
| *H01L 23/373* | (2006.01) |
| *H01L 29/778* | (2006.01) |

(52) U.S. Cl.
CPC ........ *H01L 23/49861* (2013.01); *H01L 23/34* (2013.01); *H01L 23/3672* (2013.01); *H01L 23/3675* (2013.01); *H01L 23/3737* (2013.01); *H01L 23/42* (2013.01); *H01L 23/4334* (2013.01); *H01L 23/49555* (2013.01); *H01L 23/49562* (2013.01); *H01L 23/49568* (2013.01); *H01L 29/2003* (2013.01); *H01L 29/778* (2013.01)

(58) Field of Classification Search
CPC . H01L 23/34; H01L 23/3675; H01L 23/3737; H01L 23/42; H01L 23/4334
See application file for complete search history.

(56) References Cited

U.S. PATENT DOCUMENTS 7,250,641 B2 7/2007 Saito et al.
7,838,907 B2 11/2010 Shiraishi
(Continued)

FOREIGN PATENT DOCUMENTS

DE 102014102910 A1 9/2014

OTHER PUBLICATIONS

"Power Management—Selection Guide 2016," Infineon, 2016, Retrieved on Sep. 20, 20216 at http://www.infineon.com/powermanagement-seletionguide, pp. 1-224.

*Primary Examiner* — Minh-Loan Tran
(74) *Attorney, Agent, or Firm* — Murphy, Bilak & Homiller, PLLC

(57) ABSTRACT

A packaged semiconductor includes an electrically insulating encapsulant having opposite facing first and second planar sides. A thermally conductive substrate is partially embedded in the encapsulant such that an outer side of the substrate is exposed at the first side of the encapsulant and an inner side of the substrate is contained within the encapsulant. A GaN based power semiconductor device is completely embedded in the encapsulant and includes: a main side having electrically conductive device terminals, and a rear side that faces away from the main side and is mounted on the inner side the substrate. A plurality of electrically conductive leads is partially embedded in the encapsulant and electrically connected to the device terminals. Vertical portions of the leads extend away from the substrate towards the second side of the encapsulant.

20 Claims, 4 Drawing Sheets

(56) References Cited

U.S. PATENT DOCUMENTS

| | | |
|---|---|---|
| 2011/0049580 A1 | 3/2011 | Lui et al. |
| 2011/0101466 A1 | 5/2011 | Wu |
| 2012/0223321 A1 | 9/2012 | Lin et al. |
| 2012/0223322 A1 | 9/2012 | Lin et al. |
| 2014/0252577 A1 | 9/2014 | Otremba et al. |
| 2014/0268780 A1* | 9/2014 | Wang .................... F21V 19/003 362/249.06 |
| 2014/0367847 A1* | 12/2014 | Strader ................... B23P 15/26 257/717 |
| 2015/0035134 A1* | 2/2015 | Hung .................. H01L 23/3675 257/712 |

\* cited by examiner

US 9,881,862 B1

TOP SIDE COOLING FOR GAN POWER DEVICE

TECHNICAL FIELD

The instant application relates to semiconductor packaging, and more particularly relates to efficient heat transfer packaging for type GaN based power devices.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. HEMTs are preferred in many applications due to their favorable power density, on-state resistance, switching frequency, and efficiency benefits over over conventional silicon based transistors.

HEMTs are viewed as an attractive candidate for power switching applications. A power transistor is a device that is capable of switching substantial voltages and/or currents associated with high power applications. For example, a power transistor may be required to block a voltage of at least 200 V, 400 V, 600 V or more. In addition, a power transistor may be required to conduct currents in the range of ones, tens or hundreds of amperes during normal operation. Due to the high electron mobility of the two-dimensional carrier gas in the heterojunction configuration, HEMTs offer high conduction and low losses in comparison to many conventional semiconductor transistor designs and therefore are well suited for these large operating currents.

In general, III-V semiconductor materials, such as GaN, are used to form high electron mobility semiconductor devices. With GaN technology, the presence of polarization charges and strain effects result in the realization of a two-dimensional charge carrier gas, which is a two-dimensional electron or hole inversion layer characterized by very high carrier density and carrier mobility. A two-dimensional charge carrier gas such as a 2DEG (two-dimensional electron gas) or 2DHG (two-dimensional hole gas) forms the channel region of the device. A thin, e.g. 1-2 nm, AlN layer can be provided between the GaN buffer layer and the alloy barrier layer to minimize alloy scattering and enhance 2DEG mobility.

HEMTs are typically configured as lateral devices, i.e., transistor devices in which the channel flows in a direction that is parallel to the main surface of the semiconductor substrate. Thus, HEMTs typically include electrically conductive terminals (e.g., gate, source and drain terminals) disposed on a single main surface of the semiconductor substrate that are electrically coupled to different points of the laterally extending channel. The rear side of a lateral transistor device, on the other hand, typically does not include any conductive terminals and is thus electrically inactive.

While HEMTs offer advantageous characteristics with respect to voltage and current switching capability, these devices have significantly increased power density in comparison to silicon-based counterparts. Thus, a substantial amount of heat is generated during operation of these devices, which requires innovative cooling solutions. As the technology progresses towards higher voltages and frequencies, challenges with respect to cooling become even more pronounced. Thus, package designers are seeking ways to improve cooling for GaN based HEMTs.

SUMMARY

A packaged semiconductor device is disclosed. According to an embodiment, the packaged semiconductor device includes an electrically insulating encapsulant having opposite facing first and second planar sides. A thermally conductive substrate is partially embedded in the encapsulant such that an outer side of the substrate is exposed at the first side of the encapsulant and an inner side of the substrate is contained within the encapsulant. A GaN based power semiconductor device is completely embedded in the encapsulant and includes: a main side having electrically conductive device terminals, and a rear side that faces away from the main side and is mounted on the inner side the substrate. A plurality of electrically conductive leads is partially embedded in the encapsulant and electrically connected to the device terminals. Vertical portions of the leads extend away from the substrate towards the second side of the encapsulant.

An electronic device is disclosed. According to an embodiment, the electronic device includes a circuit board having a plurality of electronic components electrically connected to one another by conductive tracks. A packaged semiconductor device is mounted on the circuit board. The packaged semiconductor device includes an electrically insulating encapsulant comprising a first side that faces away from the circuit board and a second side that faces the circuit board, a thermally conductive substrate that is partially embedded in the encapsulant such that an outer side of the substrate is exposed at the first side of the encapsulant and an inner side of the substrate is contained within the encapsulant, a GaN based power semiconductor device completely embedded in the encapsulant and including: a main side comprising electrically conductive device terminals, and a rear side that faces away from the main side and is mounted on inner side of the substrate, and a plurality of electrically conductive leads partially embedded in the encapsulant. The leads form an electrical connection between the device terminals of the semiconductor device and the conductive tracks of the circuit board.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, a packaged GaN based power semiconductor device that is configured for top side cooling is disclosed. A GaN based power semiconductor device is mounted to a thermally conductive substrate that is configured to transfer heat away from a lower side of the device. An electrically insulating encapsulant is formed around the semiconductor device and the substrate such that the semiconductor device is completely contained within the encapsulant and such that one flat surface of the substrate is exposed at an upper side of the encapsulant. Electrically conductive leads are partially embedded in the encapsulant and connected the semiconductor device are accessible at a lower side of the encapsulant. Thus, when the packaged semiconductor device is placed on a printed circuit board, a lower side of the device directly faces and electrically connects with the printed circuit board (via the leads), and an upper side of the device with an exposed portion of the thermally conductive substrate faces away from the printed circuit board. In this configuration, a large heat sink can be mounted to the upper side of the package so as to directly interface with the exposed portion of the thermally conductive substrate.

The top side cooling approach offers greater performance and cost effectiveness in comparison to bottom side cooling approaches for GaN based power semiconductor devices. With a bottom side cooling approach, GaN based power semiconductor devices are packaged in such a way that heat is carried away from the device toward a bottom side of the package. The bottom side of the package is mounted to the main surface of a printed circuit board (PCB), with the terminals of the package making direct electrical contact with the printed circuit board. Conventionally, a heat sink is provided on a rear side of the printed circuit board that is opposite from the main surface. Thermal vias may be provided in the PCB to transfer heat from the semiconductor device to the heat sink. This design suffers from the drawback of additional thermal resistance between the device package and the heat sink. The embodiments described herein advantageously dispense with this system by allowing for the mounting of heat sink directly on top of the packaged device. The design of the PCB is thus simplified. Moreover, a substantially large heat sink can be provided directly on top of the packaged device. This offers advantageous heat dissipation performance in comparison to the bottom side cooling design.

Figure 1:
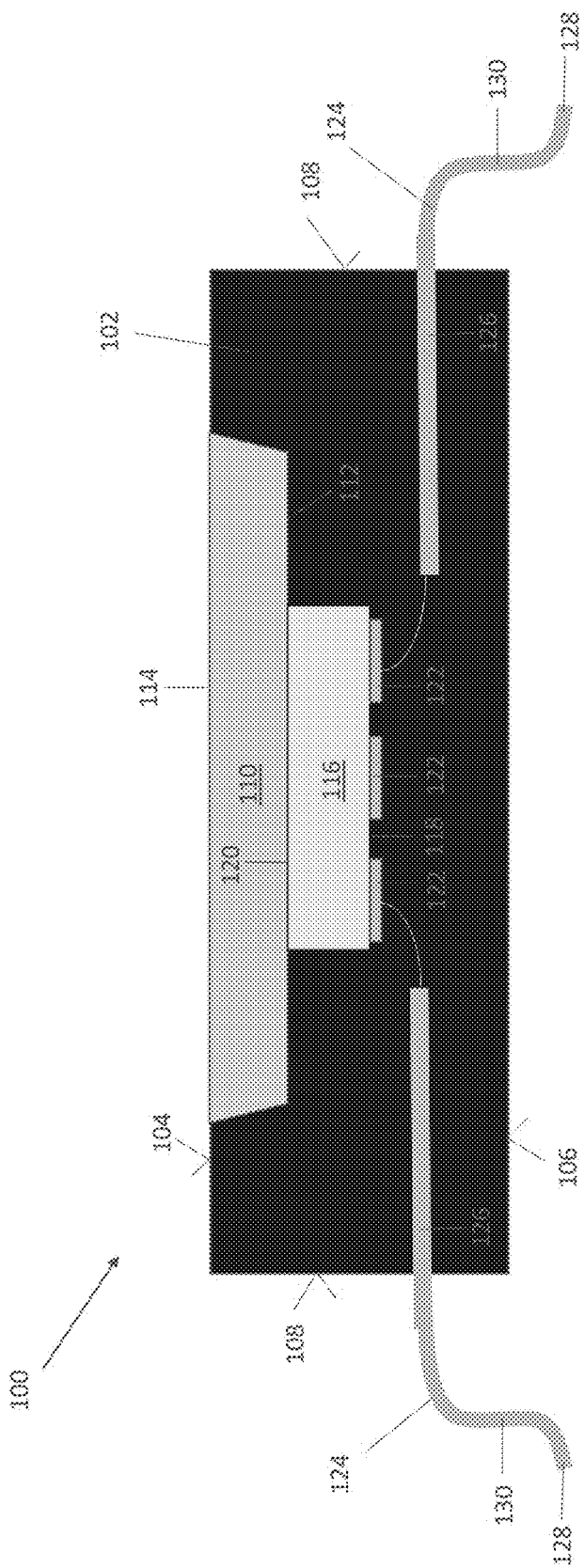
FIG. 1 depicts a packaged GaN based power semiconductor device that is configured for top side cooling, according to an embodiment.

Referring to FIG. 1, a packaged semiconductor device 100 is depicted, according to an embodiment. The packaged semiconductor device 100 includes an electrically insulating encapsulant 102. The encapsulant 102 can be any semiconductor packaging material that is used to protect and insulate semiconductor dies. Exemplary materials for the encapsulant 102 include ceramic and plastics. According to an embodiment, the encapsulant 102 includes a thermosetting plastic. The encapsulant 102 includes first and second generally planar sides 104, 106 that are opposite to one another. In addition, the encapsulant 102 includes opposite facing generally planar sidewalls 108. According to an embodiment, the first and second sides 104, 106 are parallel to one another, and the opposite facing sidewalls 108 are also parallel to one another. Alternatively, different angles of orientation between these outer walls are possible.

The packaged semiconductor device 100 further includes a thermally conductive substrate 110. The thermally conductive substrate 110 can include any material having a low thermal resistance. Exemplary materials include copper, aluminum, iron, nickel, and alloys thereof. The thermally conductive substrate 110 includes a planar inner side 112 and a planar outer side 114 that is opposite from and parallel to the inner side 112. The thermally conductive substrate 110 is partially embedded in the substrate 110 such that the outer side 114 is exposed from the encapsulant 102 at the first side 104 and the inner side 112 of the substrate 110 is contained within the encapsulant 102. That is, the encapsulant 102 is formed around the substrate 110 such that the substrate 110 is surrounded by the encapsulant 102 on all but one side. According to an embodiment, the outer side 114 of the substrate 110 is coplanar with the first side 104 of the encapsulant 102. That is, the outer side 114 and the first side 104 form a single, planar surface on the upper side of the packaged semiconductor device 100. Alternatively, the outer side 114 of the substrate 110 can be slightly raised or slightly recessed relative to the first side 104 of the encapsulant 102.

The packaged semiconductor device 100 further includes a GaN based power semiconductor device 116. The semiconductor device 116 is completely embedded in the encapsulant 102. That is, the semiconductor device 116 is confined within the volume of the encapsulant 102 such that no portion of the semiconductor device 116 is exposed from the encapsulant 102. A main side 118 of the semiconductor device 116 faces away from the substrate 110 and a rear side 120 of the semiconductor device 116 faces the substrate 110.

The GaN based power semiconductor device 116 is an integrated circuit formed from a GaN based semiconductor material. The main side 118 of the semiconductor device 116 includes electrically conductive device terminals 122 (e.g., conductive pads). In general, the semiconductor device 116 can be any active electronic component that utilizes a GaN based heterojunction to control a large voltage, e.g., at least 200 V. Examples of these devices include transistors, diodes, and thyristors. According to an embodiment, the semiconductor device 116 is a lateral HEMT device. In this embodiment, the terminals 122 of the semiconductor device 116 are configured as gate, source and drain terminals that are configured to switch an electrical current/voltage in a commonly known manner. According to an embodiment, the rear side 120 of the semiconductor device 116 is devoid of electrically conductive terminals. That is, the rear side 120 provides an electrically inactive surface.

The rear side 120 of the semiconductor device 116 is mounted on the inner side 112 of the substrate 110. The rear side 120 may be in direct physical contact with the inner side 112 of the substrate 110. Alternatively, an adhesive material may be interposed between the semiconductor device 116 and the substrate 110. According to an embodiment, the connection between the rear side 120 of the semiconductor device 116 and the inner side 112 of the substrate 110 is electrically inactive. That is, no electrical current flows between the rear side 120 of the semiconductor device 116 and the substrate 110 during operation of the packaged semiconductor device 100. If, for example, the rear side 120 of the device is devoid of electrically conductive terminals, no electrical current or voltage is applied by the semiconductor device 116 to the substrate 110 during operation of the device.

The packaged semiconductor device 100 further includes a plurality (i.e., two or more) of electrically conductive leads 124. The leads 124 can be formed from any electrically conductive material such as copper, aluminum and alloys thereof. The leads 124 are electrically connected to the terminals of the semiconductor device 116. This connection can be provided by conductive wire bonds, ribbons, or clips, for example. The leads 124 are partially embedded in the encapsulant 102. That is, portions of the leads 124 are confined within the volume of the encapsulant 102 and portions of the leads 124 protrude out of the encapsulant 102. In the embodiment of FIG. 1, the embedded portions 126 of the leads 124 extend out of the first and second sidewalls 108 of the encapsulant 102 at a direction that is substantially perpendicular to the first and second sidewalls 108.

The leads 124 are oriented in such a way that connecting ends 128 of the leads 124 are disposed at an opposite side of the packaged semiconductor device 100 as the outer exposed side of the substrate 110. Thus, when the packaged semiconductor device 100 is oriented in the manner depicted in FIG. 1, the connecting ends 128 are accessible at the second (lower) side 106 of the encapsulant 102 and the outer exposed side 114 of the substrate 110 is accessible at the first (upper) side 104 of the encapsulant 102. To this end, the leads 124 include vertical portions 130 that extend away from the substrate 110 towards the second side of the encapsulant 102. In the embodiment of FIG. 1, these vertical portions 130 are disposed outside of the encapsulant 102. Thus, the packaged semiconductor device 100 includes exposed leads 124 that bend away from the substrate 110 and towards the second (lower) side 106 of the encapsulant 102. According to an embodiment, the exposed portions of the leads 124 extend past the second side 106 of the encapsulant 102. Thus, the connecting ends 128 of the leads 124 are disposed beneath the lower side of the packaged semiconductor device 100 when the packaged semiconductor device 100 is oriented in the manner depicted in FIG. 1.

Figure 2:
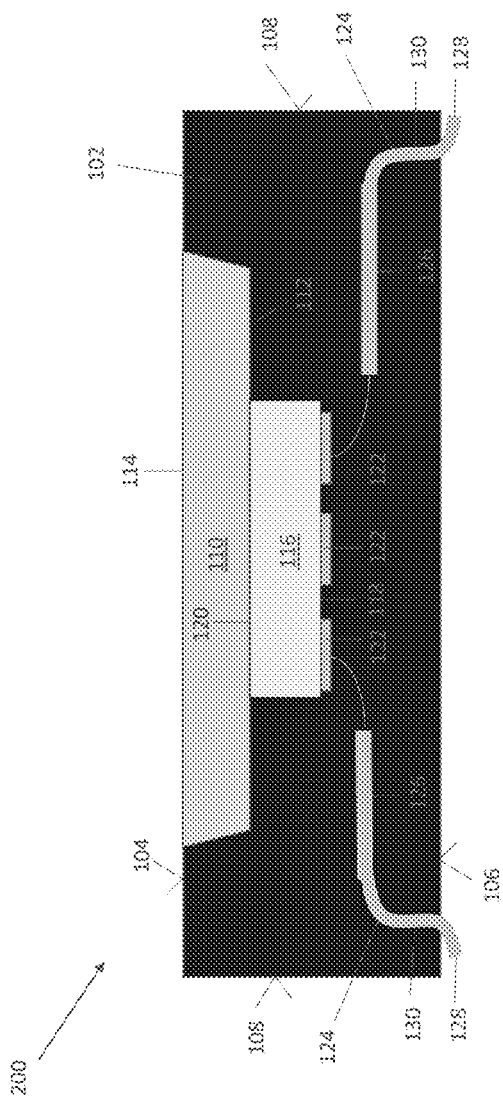
FIG. 2 depicts a packaged GaN based power semiconductor device that is configured for top side cooling, according to another embodiment.

Referring to FIG. 2, a packaged semiconductor device 200 is depicted, according to another embodiment. The embodiment of FIG. 2 is identical to the embodiment of FIG. 1 with the exception of the configuration of the leads 124. Whereas the vertical portions 130 of the leads 124 in the embodiment of FIG. 1 are outside of the encapsulant 102, the vertical portions 130 of the leads 124 in the embodiment of FIG. 2 are contained within the encapsulant 102. That is, the bending of the leads 124 occurs within the encapsulant 102 in the embodiment of FIG. 2. The connecting ends 128 of the leads 124 protrude from the second side 106 of the encapsulant 102.

Figure 3:
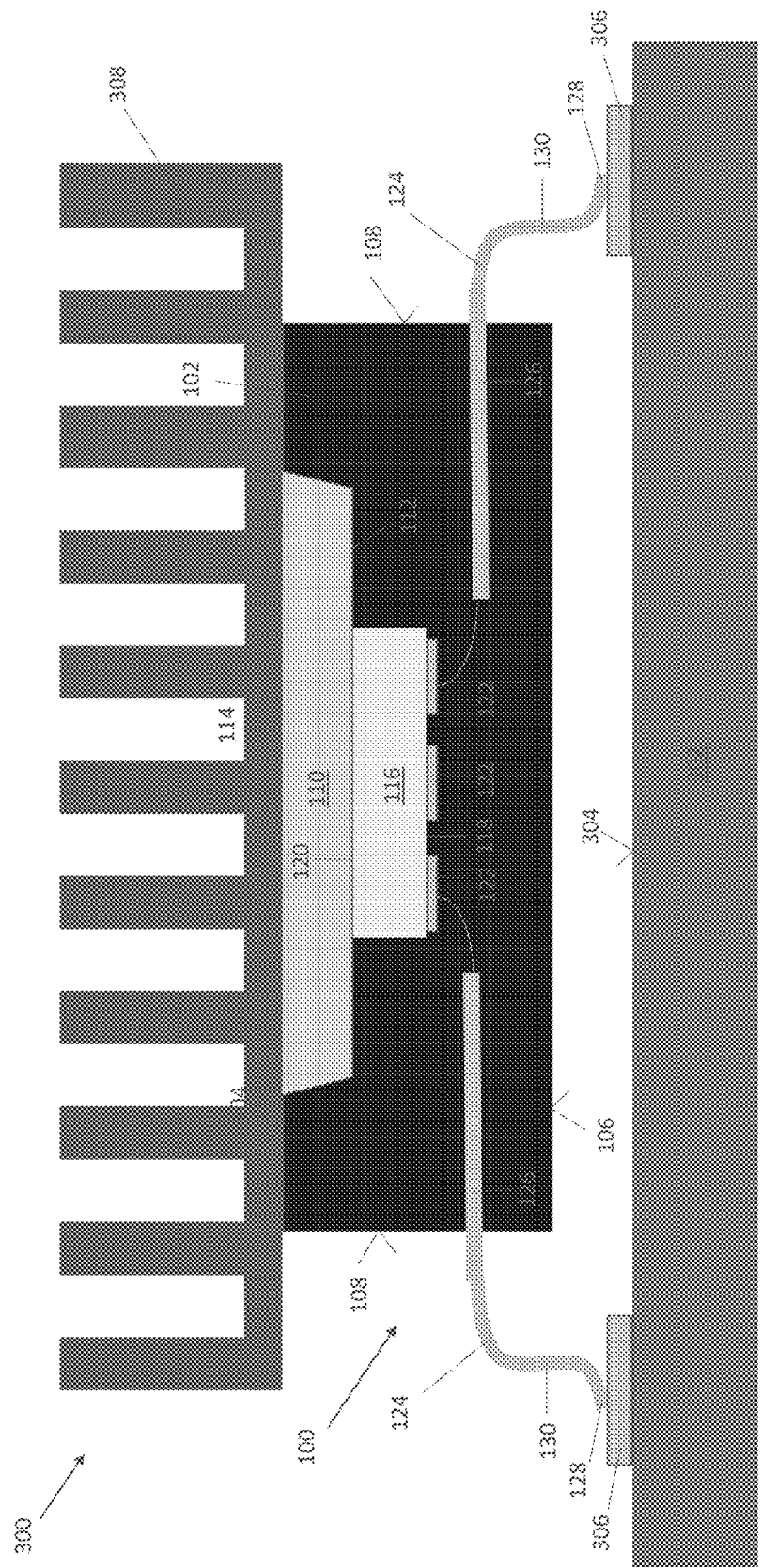
FIG. 3 depicts an electronic assembly including a circuit board, a packaged GaN based power semiconductor device, and a heat sink, according to an embodiment.

Referring to FIG. 3, an electronic assembly 300 that includes the packaged semiconductor device 100 of FIG. 1 is depicted. In addition to the packaged semiconductor device 100, the electronic assembly 300 includes a printed circuit board 302. The printed circuit board 302 can be any of a wide variety of printed circuit board that are used to support and connect a number of electronic components (e.g., integrated circuits, controllers, sensors, analog devices, capacitors, resistors, etc.) together. The printed circuit board 302 includes a main surface 304 with conductive pads 306. The conductive pads 306 are connected to conductive tracks (not shown), which in turn are connected to other electronic components.

The packaged semiconductor device 100 is mounted on the printed circuit board 302 with the second side 106 of the encapsulant 102 facing the main surface 304 of the printed circuit board 302. The leads 124 protruding from the encapsulant 102 bend downward towards the main surface 304 of the printed circuit board 302 and make direct contact with the conductive pads 306. Accordingly, an electrical connection is established between the packaged semiconductor device 100 and the other components of the printed circuit board 302 (not shown) via the conductive tracks of the printed circuit board 302.

The electronic assembly 300 further includes a heat sink 308 that is mounted on the first side 114 of the encapsulant 102 (i.e., the side that faces away from the main surface 304 of the printed circuit board 302). The heat sink 308 can be any passive or active heat exchanging device that is configured to carry energy away from the packaged semiconductor device 100. As can be seen, the heat sink 308 can be substantially larger than the packaged semiconductor device 100.

According to an embodiment, the heat sink 308 makes direct physical contact with the outer side 114 of the substrate 110. Thus, a highly efficient heat transfer mechanism is provided, as the heat generated by the semiconductor device 116 transfers directly to the heat sink 308 via the substrate 110. By contrast, in a conventional configuration in which a heat sink is disposed on the bottom side of the printed circuit board 302, there is increased thermal resistance attributable to the transfer of heat through the printed circuit board 302.

According to an embodiment, no electrical isolation layer is provided in the packaged semiconductor device 100. In many conventional configurations, a conductive substrate serves a dual purpose of transferring heat and providing an electrical terminal. For example, a large conductive substrate can be used to provide a source-terminal in the case of a conventional source-down configured vertical power transistor. As the present embodiments include a GaN based lateral power transistor without any electrically active connection between the die and the substrate 110, the substrate 110 does not act as an electrical terminal and is only used to transfer heat away from the semiconductor device 116. According to an embodiment, the substrate 110 is electrically floating. That is, the substrate 110 is disconnected from any electrical terminals of the packaged semiconductor device 100. Alternatively, the substrate 110 can be tied to a fixed potential (e.g., GND) by connecting the substrate 110 to a designated ground lead. In any case, no electrical isolation between the substrate 110 and the heat sink 308 is needed. Thus, no electrical isolation layer is provided in the packaged semiconductor device 100, or more generally no electrical isolation mechanism is provided between the substrate 110 and the heat sink 308. Thus, the substrate 110 can make direct contact with the heat sink 308 or can be connected to the heat sink 308 by thermally conducive adhesives that are not necessarily electrically isolating.

Figure 4:
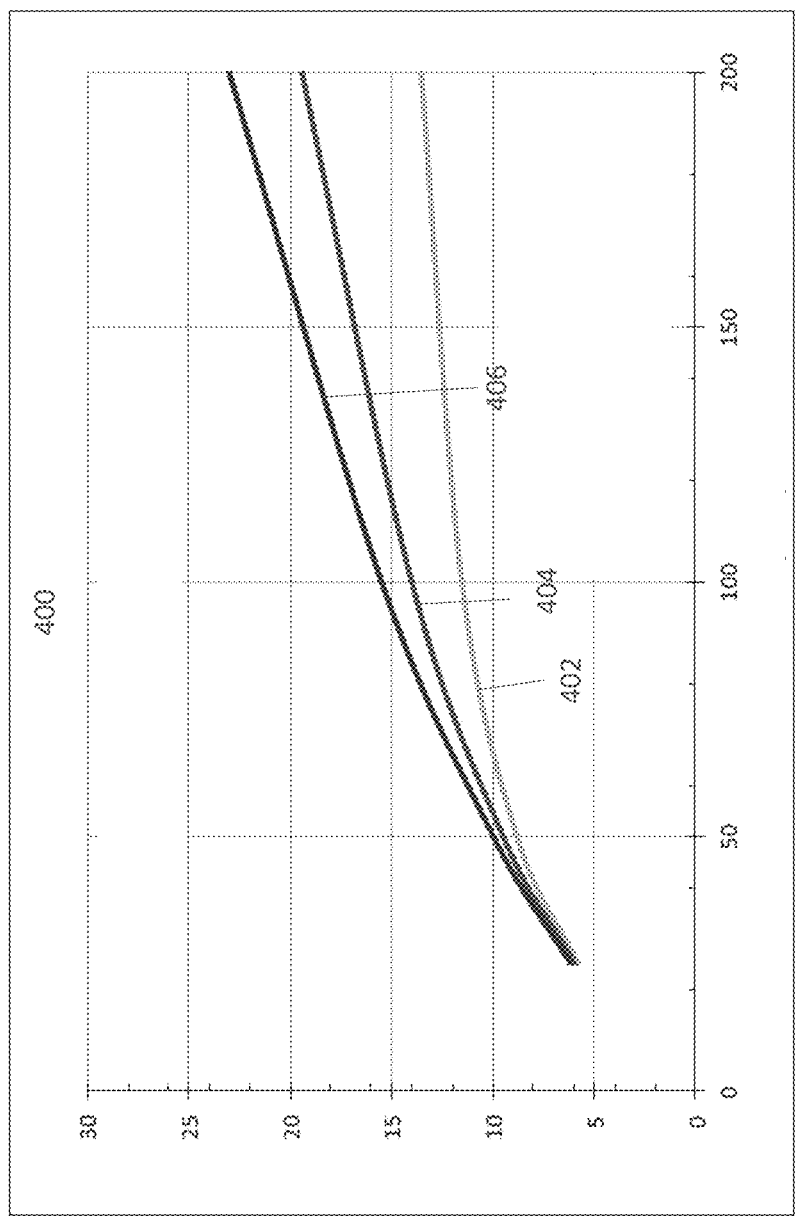
FIG. 4 depicts a graph showing the heat dissipating performance for top side cooling packages of various substrate thickness as a function of exposed substrate area, according to an embodiment.

Referring to FIG. 4, a graph 400 of maximum power losses (in Watts) versus exposed area (in mm$^2$) of the outer side 114 of the substrate 110 is depicted. Three different curves are shown for packaged semiconductor devices 100 having substrates 110 of different thickness. In a first curve 402, a 12 mm$^2$ semiconductor device 116 mounted to a 200 nm thick substrate 110 is plotted. In a second curve 404, a 12 mm$^2$ semiconductor device 116 mounted to a 500 nm thick substrate 110 is plotted. In a third curve 406, a 12 mm$^2$ semiconductor device 116 mounted to a 1000 nm thick substrate 110 is plotted. As can be seen, decreasing the thickness of the substrate 110 has a positive effect on the heat transfer efficiency of the system. Thus, according to an embodiment, the substrate 110 has a thickness that is below 200 nm, such as 100 nm, and an exposed area of the outer side 114 of the substrate 110 is above 100 mm$^2$, such as 200 mm$^2$.

The examples of FIGS. 1 and 2 represent just two examples of package types that are possible for the packaged semiconductor device 100. As is well known in the art, a wide variety of package types have evolved to meet different requirements. The packaged semiconductor device 100 have the format any of these different package types with terminals (e.g., leads, pads, solder balls, etc.) disposed on a lower planar side of the package, and the substrate 110 disposed on an upper side that faces away from the leads. Examples of these package types include QFNL (quad flat no lead), DIP (dual inline packages), through hole packages, and PGA (pin grid array) packages, to name a few.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

In the context of the present disclosure, the term "ohmic" refers to a contact having an approximately constant ratio of voltage/current that does not depend from the polarity of the applied voltage. The term "ohmic contact" also encompasses contacts having a voltage/current characteristic which is not strictly linear but includes minor non-linearities.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A packaged semiconductor device, comprising:
an electrically insulating encapsulant comprising opposite facing first and second planar sides;
a thermally conductive substrate that is partially embedded in the encapsulant such that an outer side of the substrate is exposed at the first side of the encapsulant and an inner side of the substrate is contained within the encapsulant;
a GaN based power semiconductor device that is completely embedded in the encapsulant and comprising: a main side comprising electrically conductive device terminals, and a rear side that faces away from the main side and is mounted on the inner side of the substrate; and
a plurality of electrically conductive leads being partially embedded in the encapsulant and electrically connected to the device terminals, wherein vertical portions of the leads extend away from the substrate towards the second side of the encapsulant.

2. The packaged semiconductor device of claim 1, wherein a connection between the rear side of the semiconductor device and the inner side of the substrate is electrically inactive.

3. The packaged semiconductor device of claim 2, wherein the substrate is electrically floating or connected to a ground terminal of the packaged semiconductor device.

4. The packaged semiconductor device of claim 3, wherein the GaN based power semiconductor device is a lateral HEMT device, and wherein the rear side of the semiconductor device is devoid of electrically conductive terminals.

5. The packaged semiconductor device of claim 4, wherein the outer side of the substrate is coplanar with the first side of the encapsulant.

6. The packaged semiconductor device of claim 5, wherein the electrically insulating encapsulant further comprises first and second sidewalls extending between the first and second planar sides, wherein embedded portions of the leads extend out of the first and second sidewalls at a direction that is substantially perpendicular to the first and second sidewalls, and wherein exposed portions of the leads comprise the vertical portions that extend towards the second side of the encapsulant.

7. The packaged semiconductor device of claim 6, wherein the exposed portions of the leads extend past the second side of the encapsulant.

8. The packaged semiconductor device of claim 5, wherein the vertical portions of the leads are contained within the encapsulant, and wherein exposed portions of the leads protrude from the second side of the encapsulant.

9. The packaged semiconductor device of claim 2, further comprising a heat sink mounted on the first planar side of the encapsulant, the heat sink making direct physical contact with the outer side of the substrate.

10. The packaged semiconductor device of claim 9, wherein the packaged semiconductor device is devoid of an electrical isolation layer on the second side of the encapsulant.

11. An electronic device, comprising:
a circuit board comprising a plurality of electronic components electrically connected to one another by conductive tracks;
a packaged semiconductor device mounted on the circuit board, the packaged semiconductor device comprising:
an electrically insulating encapsulant comprising a first side that faces away from the circuit board and a second side that faces the circuit board;
a thermally conductive substrate that is partially embedded in the encapsulant such that an outer side of the substrate is exposed at the first side of the encapsulant and an inner side of the substrate is contained within the encapsulant;
a GaN based power semiconductor device that is completely embedded in the encapsulant and comprises: a main side comprising electrically conductive device terminals, and a rear side that faces away from the main side and is mounted on the inner side of the substrate; and
a plurality of electrically conductive leads being partially embedded in the encapsulant and form an electrical connection between the device terminals of the semiconductor device and the conductive tracks of the circuit board.

12. The electronic device of claim 11, wherein a connection between the rear side of the semiconductor device and the inner side of the substrate is electrically inactive.

13. The electronic device of claim 12, wherein the substrate is electrically floating or connected to a ground terminal of the packaged semiconductor device.

14. The electronic device of claim 13, wherein the GaN based power semiconductor device is a lateral HEMT device, and wherein the rear side of the semiconductor device is devoid of electrically conductive terminals.

15. The electronic device of claim 14, wherein the outer side of the substrate is coplanar with the first side of the encapsulant.

16. The electronic device of claim 15, wherein the electrically insulating encapsulant further comprises first and second sidewalls extending between the first and second planar sides, wherein embedded portions of the leads extend out of the first and second sidewalls at a direction that is substantially perpendicular to the first and second sidewalls, and wherein exposed portions of the leads comprise vertical portions that extend towards the circuit board and away from the substrate.

17. The electronic device of claim 16, wherein the exposed portions of the leads extend past the second side of the encapsulant.

18. The electronic device of claim 15, wherein embedded portions of the leads extend directly to the second side and are connected to conductive terminals that are disposed on the second side, and wherein the conductive terminals physically and electrically connect to the conductive tracks.

19. The electronic device of claim 13, further comprising a heat sink mounted on the second planar side of the encapsulant, the heat sink making direct physical contact with the outer side of the substrate.

20. The electronic device of claim 13, wherein the packaged semiconductor device is devoid of an electrical isolation layer on the second side of the encapsulant.

* * * * *